United States Patent
Ferber et al.

(10) Patent No.: US 6,858,807 B2
(45) Date of Patent: Feb. 22, 2005

(54) SUBSTRATE FOR RECEIVING A CIRCUIT CONFIGURATION AND METHOD FOR PRODUCING THE SUBSTRATE

(75) Inventors: Gottfried Ferber, Warstein (DE); Reimund Pelmer, Soest (DE)

(73) Assignee: EUPEC Europaeische Gesellschaft fuer Leistungshalbleiter mbH, Warstein-Belecke (DE)

( * ) Notice: Subject to any disclaimer, the term of this patent is extended or adjusted under 35 U.S.C. 154(b) by 16 days.

(21) Appl. No.: 10/308,049

(22) Filed: Dec. 2, 2002

(65) Prior Publication Data

US 2003/0110627 A1 Jun. 19, 2003

Related U.S. Application Data

(63) Continuation of application No. PCT/EP01/05674, filed on May 17, 2001.

(30) Foreign Application Priority Data

May 30, 2000 (DE) .......................................... 100 26 743

(51) Int. Cl.[7] .......................... H01R 12/04; H05K 1/11
(52) U.S. Cl. ....................... 174/261; 174/252; 361/809; 29/830
(58) Field of Search ................................ 174/261, 252, 174/260; 361/709, 807, 809, 760, 772; 439/493; 29/830, 832

(56) References Cited

U.S. PATENT DOCUMENTS

| | | | |
|---|---|---|---|
| 5,382,830 A | * | 1/1995 | Akyurek et al. ............ 257/701 |
| 5,539,254 A | * | 7/1996 | Eytcheson et al. .......... 257/691 |
| 5,923,085 A | | 7/1999 | Donegan et al. |
| 5,924,191 A | | 7/1999 | Credle, Jr. et al. |
| 5,938,104 A | * | 8/1999 | Saxelby et al. ............. 228/118 |
| 6,182,358 B1 | * | 2/2001 | Schulz-Harder ............. 29/846 |

FOREIGN PATENT DOCUMENTS

| | | |
|---|---|---|
| EP | 0 523 598 A1 | 1/1993 |
| EP | 0 632 684 A2 | 1/1995 |
| GB | 1 457 809 | 12/1976 |
| JP | 57 030 354 | 2/1982 |

* cited by examiner

*Primary Examiner*—Kamand Cuneo
*Assistant Examiner*—I B Patel
(74) *Attorney, Agent, or Firm*—Laurence A. Greenberg; Werner H. Stemer; Ralph E. Locher

(57) ABSTRACT

A substrate is adapted to accommodate a circuit configuration. The novel substrate is stable under alternating loads and it favorably dissipates heat. To this end, the substrate has a fastening zone to be connected to a contact element that is to be provided. The fastening zone is fixed on the carrier substrate with a first section. A second section projects from the plane of the carrier substrate, and the first and the second sections are adapted to be electrically and mechanically connected to the contact element.

22 Claims, 3 Drawing Sheets

SUBSTRATE FOR RECEIVING A CIRCUIT CONFIGURATION AND METHOD FOR PRODUCING THE SUBSTRATE

CROSS-REFERENCE TO RELATED APPLICATION

This application is a continuation of copending International Application No. PCT/EP01/05674, filed May 17, 2001, which designated the United States and which was not published in English.

BACKGROUND OF THE INVENTION

Field of the Invention

The invention relates to a substrate for receiving a circuit configuration of electronic components and to a method of producing such a substrate for receiving a circuit configuration. The substrate for receiving a circuit configuration of electronic components, in particular for a power semiconductor module or the like, includes a substantially planar, in particular ceramic, carrier substrate, which is arranged in a substantially lateral plane. A contact substrate, preferably a metallic contact substrate, which is provided at least partly in the form of surface regions on at least one of the surfaces of the carrier substrate and which is adapted for the contact-connection of electronic components. And at least one fixing region, which is configured for receiving and/or for mechanically and electrically connecting a contact element designed for outputting and/or taking up electric current, Nowadays circuit configurations are customarily applied to a substrate that has been prepared for receiving them and are fixed and electrically contact-connected there. Such a substrate is formed by a circuit board, for example, or else by another layered structure, for example a DCB substrate, which is employed in power semiconductor modules.

The substrates for receiving a circuit configuration of electronic components are generally formed by a substantially planar, in particular ceramic, carrier substrate that is arranged in a substantially lateral plane and extends there. These base or carrier substrates are customarily produced in the form of thin rectangular or square plates. A, in particular metallic, contact substrate is formed on the carrier substrate, which contact substrate is provided at least partly in the form of surface regions on at least one of the surfaces of the carrier substrate and is designed for the contact-connection of electronic components. In this way, a layer structure is produced wherein the underlying carrier substrate yields the mechanical stability and durability and wherein the contact substrate applied on the carrier substrate realizes the mechanical fixing and also the electrical contact-connection and interconnection of the electronic components of the circuit configuration.

For external communication and, in particular, for impressing and tapping off power signals, at least one fixing region is provided, which is designed for receiving and/or mechanically and electrically connecting a contact element designed for outputting and/or taking up electric current.

It is problematic in the case of the fixing regions that, in interaction with the contact elements to be fixed to the fixing regions, the latter must have both a high mechanical stability with regard to alternating thermal loading and a sufficient heat dissipating characteristic.

Although mechanically particularly stable plug contacts, press-fitted or cast-in contacts on substrates for receiving a circuit configuration are known in the prior art, these known and mechanically stable fixing regions or contact elements have the disadvantage that they are poor conductors of heat and, consequently, the heat loss taken up in the contact element can only be poorly transmitted to the substrate and, in particular, to the cooling regions thereof.

On the other hand, however, fixing regions and corresponding contact elements are known which, by way of example, are soldered on a DCB substrate, namely on the latter's metallic area of the contact substrates formed as surface regions. Although such a soldered contact enables a particularly good heat dissipation owing to the good thermal conductivity both of the solder and of the contact substrate, on account of the blunt soldering connection on the contact substrate surface, which is generally of substantially planar design, such a connection does not adequately withstand the alternating mechanical loading on account of the thermal cycles, with the result that in the case of this known form of fixing regions, on account of the alternating mechanical loading, it is often possible to observe a premature detachment of the fixing region, that is to say in particular of the contact substrate on the carrier substrate, and/or cracking in these regions.

SUMMARY OF THE INVENTION

It is accordingly an object of the invention to provide a substrate for receiving a circuit configuration of electronic components and a method for producing the substrate which overcome the above-mentioned disadvantages of the heretofore-known devices and methods of this general type and wherein, in a particularly simple yet reliable manner, it is possible to realize a fixing for contact elements of the circuit configuration which has particularly favorable heat dissipation properties for the contact elements to be provided and, in particular, for the corresponding fixing regions and which nevertheless at the same time withstands alternating mechanical loading on account of the thermal cycles particularly well.

With the foregoing and other objects in view there is provided, in accordance with the invention, a substrate for receiving a circuit configuration of electronic components (e.g., a power semiconductor module), comprising:

a substantially planar carrier substrate defining a plane and having a surface;

a contact substrate formed at least partly of surface regions disposed on the surface of the carrier substrate and adapted to be connected to electronic components of the circuit configuration;

the contact substrate including a contiguous contact substrate region;

the contact substrate region having a first part forming a surface region disposed on and mechanically connected to the carrier substrate;

the contact substrate region having a second part projecting out of the plane of the carrier substrate; and the first part and the second part of the contact substrate region forming at least a part of a fixing region adapted to receive a contact element for conducting electrical current and for electrically and mechanically connecting to the contact element.

A generic substrate for receiving a circuit configuration of electronic components, in particular for a power semiconductor module or the like, has a substantially planar carrier substrate which is arranged in a substantially lateral plane. Furthermore, a contact substrate is provided, which is designed at least partly in the form of surface regions on at least one of the surfaces of the carrier substrate and for the contact-connection of electronic components. In addition, at least one fixing region is provided, which is designed for receiving and/or mechanically and electrically connecting a contact element designed for outputting and/or taking up electric current.

The novel substrate for receiving a circuit configuration of electronic components has a fixing region that is formed in each case at least in part by a contiguous contact substrate region, in that this contact substrate region, at least with respect to a first part, forms a surface region which is arranged on the carrier substrate and is mechanically connected thereto, and in that this contact substrate region is furthermore designed, with respect to a second part, in a manner essentially extending out of the plane of the carrier substrate. Furthermore, it is provided according to the invention that in each case both the first part and the second part of the contact substrate region that partly forms the contact region are designed for electrical and mechanical connection to at least one contact element to be provided.

A core idea in the configuration of the substrate according to the invention thus consists in designing the fixing region that is necessary for the contact-connection and fixing of a contact element to be provided in the form of a region of the contact substrate that is present anyway on the carrier substrate. This is because, on account of the production process, for example in the context of the production of a customary DCB substrate, the contact substrate on the carrier substrate has particularly favorable properties with regard to heat dissipation and in particular, however, also with regard to the particularly good mechanical coupling of the contact substrate on the carrier substrate.

Since the contact elements that are customarily to be provided generally extend out of the plane of the substrate for receiving the circuit configuration, in particular are arranged perpendicularly thereto, a further basic idea of the invention is to be seen in the fact that the contact substrate region forms, with a first part, a surface region on the carrier substrate in order to be arranged on the carrier substrate and be mechanically connected thereto, and that, secondly, a second part of the contact substrate region is designed in a manner essentially extending out of the plane of the carrier substrate. What is thereby achieved is that a contact element to be provided can be electrically and mechanically connected both to the first part of the contact substrate region and to the second part of the contact substrate region. Consequently, the substrate according to the invention is created with an angular arrangement and connection of a contact element to be provided in the fixing region, thereby avoiding the mechanically unfavorable blunt connection, in particular blunt soldering, from the prior art. What is thereby also achieved according to the invention is that the connection between fixing region and contact element to be provided withstands alternating mechanical and thermal loading particularly well.

On the other hand, the described angular arrangement of the fixing region has the advantage that a particularly favorable heat transfer to fixing region and thus, because the first part thereof is connected to the carrier substrate, also to the entire substrate is also possible via the larger contact area provided relative to the prior art between fixing region and contact element to be provided.

Thus, what is achieved overall according to the invention is that a fixing of a contact element to be provided at the same time withstands alternating mechanical loading on account of thermal cycles and a particularly favorable heat dissipation of the fixing region and of the contact element is also possible.

In accordance with an advantageous feature of the invention, the fixing region is configured as an edge region of the substrate or it is formed in such edge region. This has the advantage of enabling expedient utilization precisely also of the edge regions of the substrate for receiving a circuit configuration. Usually, the circuit density is likely to be lower in the edge regions of the substrate, so that the edge regions are often utilized less. With the design of the edge regions as fixing region for contact elements to be received, the entire substrate is utilized in a particularly favorable manner.

In accordance with a preferred exemplary embodiment of the invention, an edge region of the substrate, which edge region is oriented out of the substantially planar lateral plane of the substrate, is provided as fixing region. In this case, it is provided, in particular, that, for this purpose, the edge region of the substrate is at least partly bent out or bent up out of the substantially planar lateral plane of the substrate. What is achieved by these measures is that the substrate for receiving a circuit configuration of electronic components can be produced in a conventional manner. In this case, there is initially no need for particular precautions for forming the contact-connection, for example the provision of free substrate areas in the central region of the substrate. The fixing regions, which are then later to serve to receive contact elements that are to be provided, are then produced simply by the edge regions of the substrate, which often remain unpopulated anyway, being set up or oriented on the plane of the substrate, in particular by a bending-up process.

For a particularly favorable heat dissipation of the substrate during operation with a circuit configuration of electronic components that is to be received, it is provided that a metalization layer is formed on the underside of the substrate, which metalization layer serves in particular for heat dissipation of the substrate.

In a particularly advantageous application, the substrate is configured as a DCB substrate or the like. Such a DCB substrate is often used in the field of power semiconductor modules and has particularly favorable mechanical and heat dissipation properties.

In this case, it is provided that the fixing region is designed as a region of the contact substrate which is bent up on the lateral plane of the substrate, a recess, perforation or interruption being provided in the carrier substrate in the region of the bend—which, if appropriate, is yet to be made. This has the advantage, in particular in the production method, that the copper layer provided on the DCB substrate can be bent over by simple mechanical methods, for example also in the context of automation, to be precise without having to overcome the mechanical resistances of a carrier substrate to be ruptured, which is often formed as a ceramic substance. This interruption or perforation of the carrier substrate in the region of the bend to be implemented need not be complete, rather it also suffices, under certain circumstances, to incipiently tear or recess the carrier substrate to a specific proportion, in order thus to create a desired breaking point which breaks through as a type of perforation in the bending process.

In a further exemplary embodiment, it is provided that at least one contact element is formed, which is electrically and mechanically connected to the contact substrate via the fixing region and which is designed for outputting and/or taking up electric current and, to that end, has a contact, which extends in particular essentially out of the lateral plane of the carrier substrate, wherein case the contact element is electrically and mechanically connected in each case both to the first part and to the second part of the contact substrate region that at least partly forms the fixing region. This configuration thus utilizes precisely the advantages of the substrate according to the invention that are obtained with the provision of the fixing region described above.

For space-saving purposes, it is particularly favorable that the contact of the contact element essentially extends out of the lateral planar plane of the substrate for receiving a circuit configuration. A particularly favorable mechanical fixing in the fixing region results precisely from the fact that the contact element is mechanically connected both to the first part and to the second part of the fixing region. At the same time, this intimate mechanical contact-connection is also accompanied by a particularly high heat transfer from the contact element to the substrate in operation.

With the above and other objects in view there is also provided, in accordance with the invention, a method for producing the above-outlined substrate. The method comprises the following steps:

providing a carrier substrate defining a plane, and disposing a contact substrate thereon;

forming a recess in the carrier substrate at a predetermined bending location thereof substantially in a contiguous portion of the contact substrate;

bending the contiguous portion along the bending location defined by the recess to form a bending region projecting out of the plane of the carrier substrate and forming at least a part of a fixing region, to thereby produce the above substrate.

Other features which are considered as characteristic for the invention are set forth in the appended claims.

Although the invention is illustrated and described herein as embodied in a substrate for receiving a circuit configuration and method for producing it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
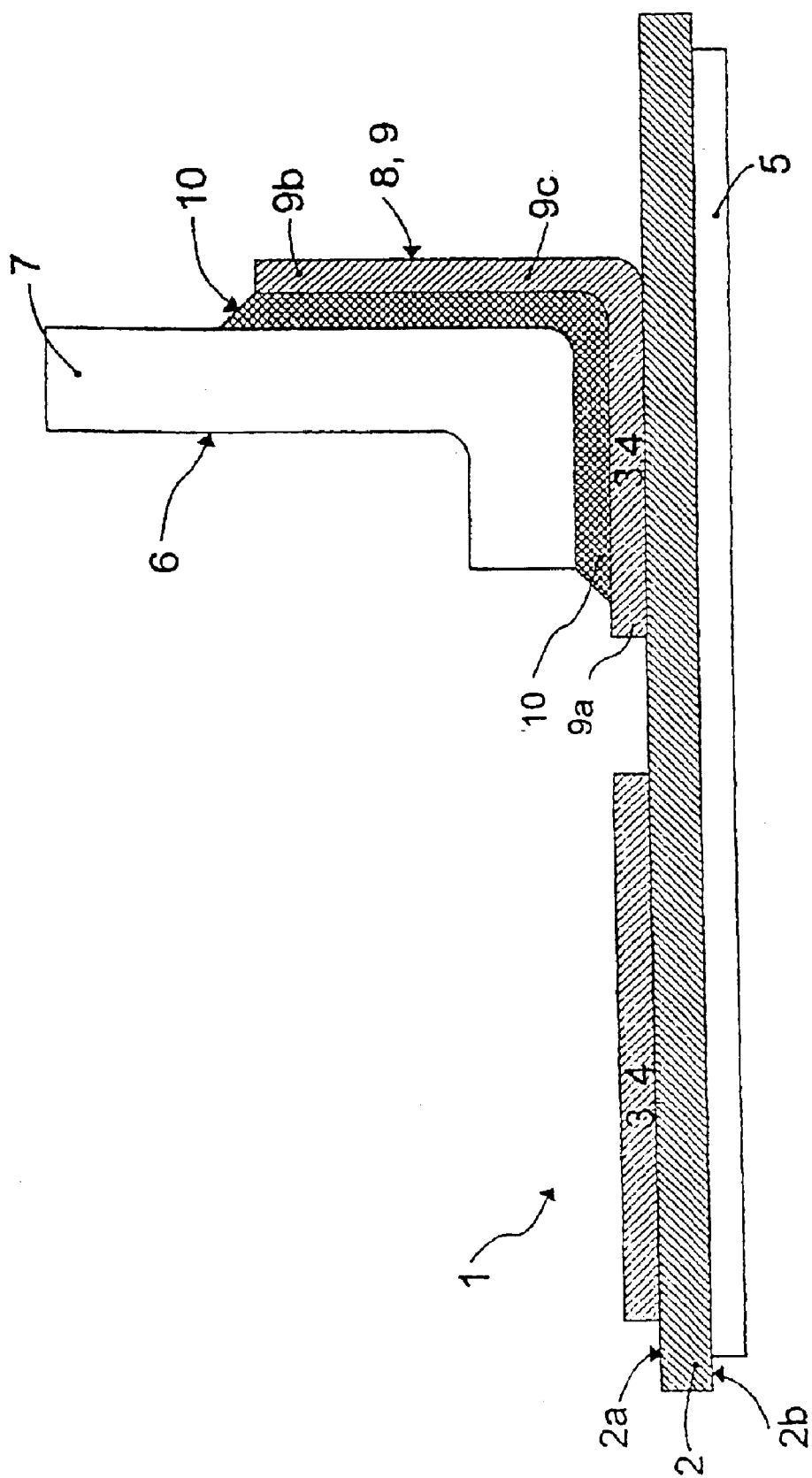
FIG. 1 is a partial sectional side view of a first exemplary embodiment of the substrate according to the invention for receiving a circuit configuration.

Referring now to the figures of the drawing in detail and first, particularly, to FIG. 1 thereof, there is shown, in sectional side view, a first exemplary embodiment of the substrate 1 for receiving a circuit configuration.

A carrier substrate 2 carries a contact substrate 3 on its topside 2a. Surface regions 4 of the contact substrate 3 are formed on the topside or upper surface 2a of the carrier substrate. A continuous area of a heat dissipation substrate 5 is provided on the underside 2b of the carrier substrate 2. The heat dissipation substrate 5 is preferably metallic.

The surface region 4 of the contact substrate 3 shown on the right-hand side in FIG. 1 is simultaneously configured as a contact substrate region 9 serving as fixing region 8. To that end, the contact substrate region 9 is mechanically fixed by a first part 9a on the topside 2a of the carrier substrate 2. In FIG. 1, a second part 9b of the contact substrate region 9 extends substantially perpendicularly out of the substantially planar and lateral plane of the substrate 2, a bend or a bending region 9c being formed in the transition from the first part 9a to the second part 9b in the contact substrate region 9.

A contact element 6 with a contact 7 that essentially extends perpendicularly out of the lateral and planar plane of the substrate 2 is mechanically fixed and electrically contact-connected on the concave side of the contact substrate region 9 by means of a soldering 10.

It can be discerned that the soldering connection 10 is an angular or angularly arranged contact-connection of the contact element 6 to the fixing region 8. This angular arrangement produces the largest possible areal contact between the contact element 6 and the fixing region 8, which leads to a good mechanical attachment and, what is more, to a good electrical and thermal contact between the contact element 6 and the fixing region 8.

Figure 2A:
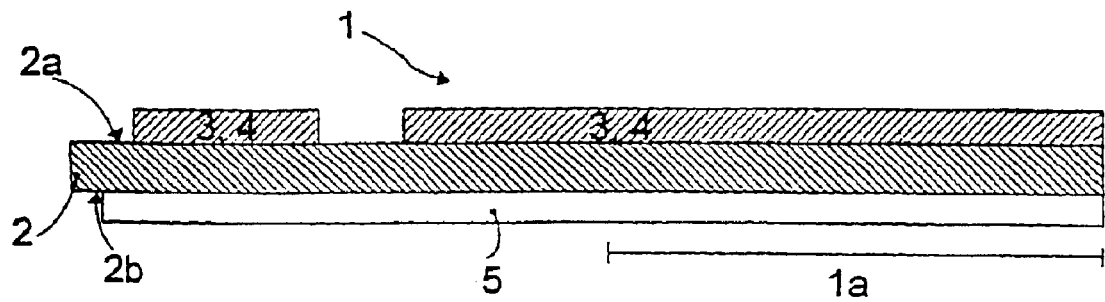
FIGS. 2A–2C are partial sectional side views illustrating different production stages of a further exemplary embodiment of the substrate according to the invention for receiving a circuit configuration.
Figure 2B:
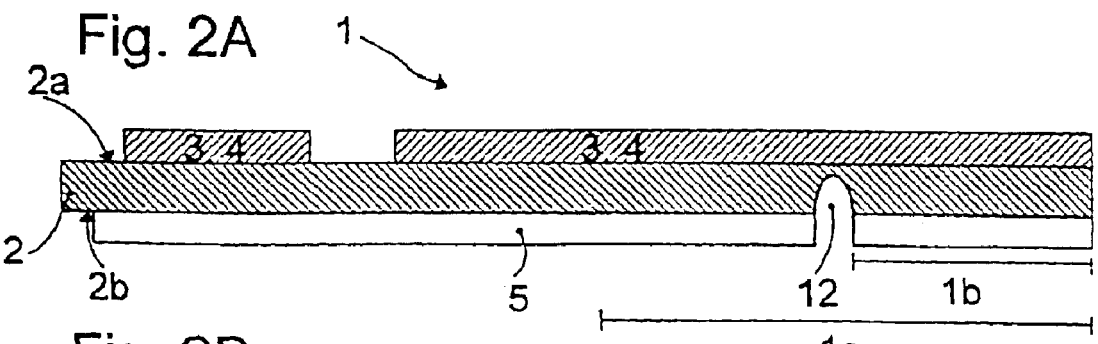
Figure 2C:
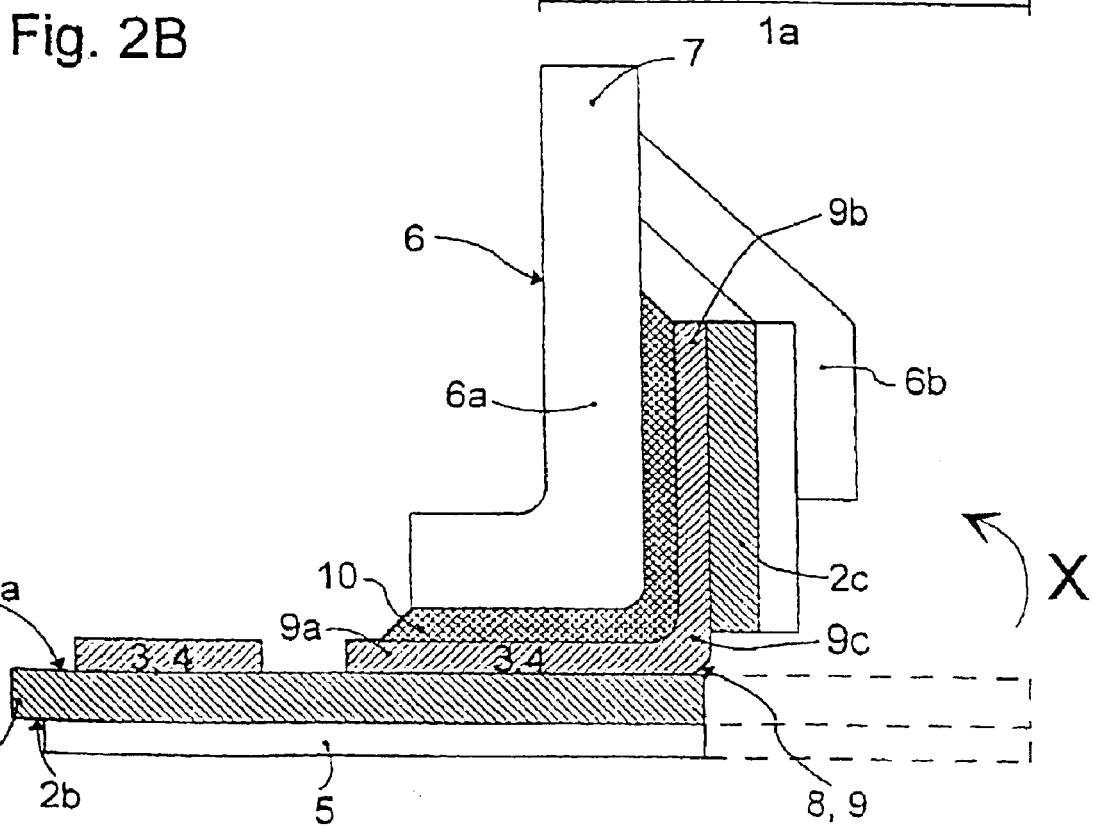
Figure 3:
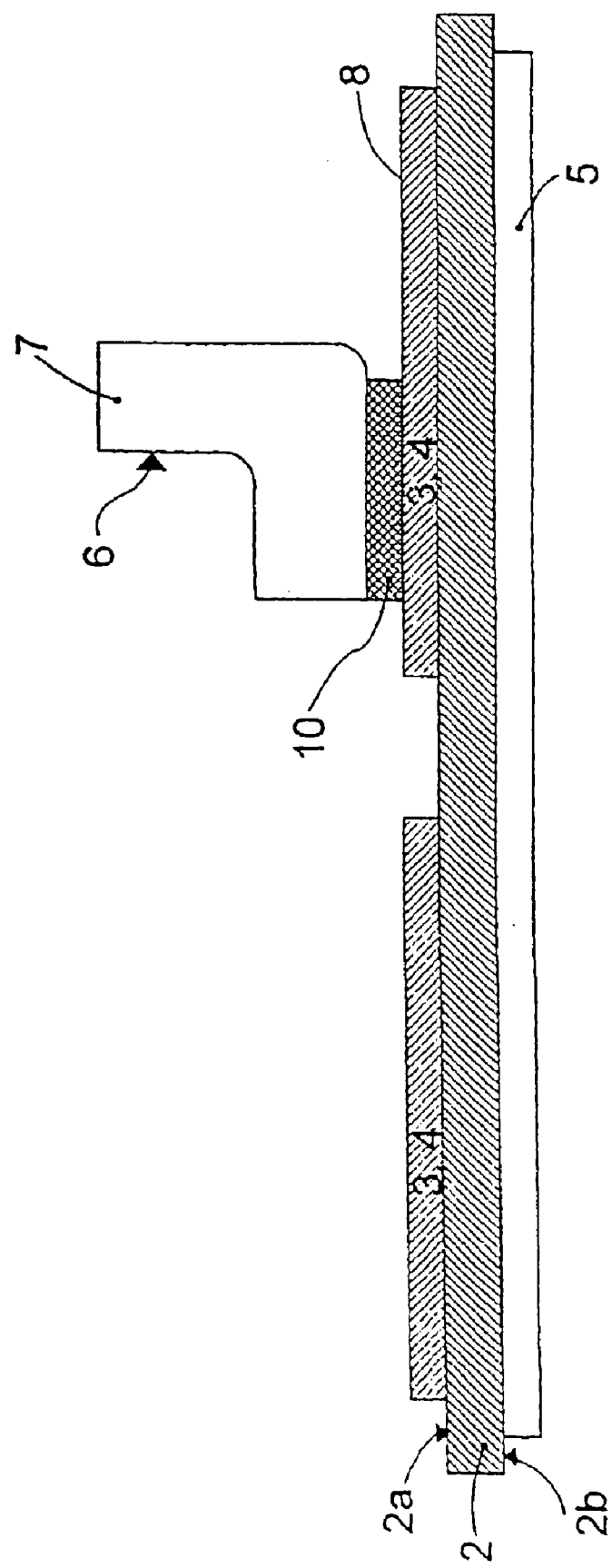
FIG. 3 is a partial sectional side view of a prior art substrate for receiving a circuit configuration.

FIGS. 2A to 2C show three different production stages for a second embodiment of the substrate 1 according to the invention for receiving a circuit configuration, in diagrammatic and sectional side view.

In all three FIGS. 2A to 2C, a contact substrate region 9 from a contact substrate 3 is formed on the topside 2a of the carrier substrate 2. The underside 2b of the carrier substrate 2 remains free in this exemplary embodiment of the substrate for receiving a circuit configuration.

In FIG. 2A, the contact substrate region 3 still forms a conventional complete surface region 4 on the topside 2a of the carrier substrate 2, to be precise in an edge region 1a of the substrate for receiving a circuit configuration of electronic components.

In the production phase for the substrate 1 according to the invention as shown in FIG. 2B, proceeding from the underside 2b of the carrier substrate 2, a recess 12 has been made in the form of a groove below the contact substrate region 9, as a result of which the edge region 1a of the substrate 1 is subdivided into a narrower edge region 1b or a strip.

The production stage shown in FIG. 2C shows that, when the edge region 1b of the substrate 1 is bent up in the direction of the arrow X shown in FIG. 2B, the recess 12 in the carrier substrate 2 shown in FIG. 2B functions as a desired breaking point or edge, so that when a bending force is exerted in the direction of the arrow X shown in FIG. 2b, the remainder of the carrier substrate 2 in the groove 12 does not offer any appreciable mechanical resistance, and, consequently, the contact substrate region 9 undergoes transition, by a bending-up process, into a form wherein a bend 9c is produced in its central region, whereas a first part 9a of the contact substrate region 9 remains mechanically fixed on the topside 2a of the substrate 2 and a second part 9b of the contact substrate region 9 extends substantially perpendicularly out of the planar and lateral plane of the carrier substrate 2.

A part 2c of the carrier substrate separated by the groove 12 and the desired breaking point still adheres in the region of the second part 9b of the contact substrate region 9.

The contact substrate region 9 which is thus set up and bent over functions, with its first part 9a, its bend 9c and its second part 9b, as a fixing region 8 for the contact element 6, which is likewise shown in FIG. 2C and has two fixing limbs 6a and 6b of different length in the embodiment shown in FIG. 2C. On the concave inner side of the fixing region 8, there is once again formed, by way of a soldering connection 10, an electrical and mechanical contact with the contact element 6, namely with a complementarily shaped left-hand fixing limb 6a, in angled form, of the contact element 6. On the other side, the right-hand shorter fixing limb 6b of the contact element 6 that is opposite the longer left-hand limb 6a is supported against the substrate end piece 2c that is concomitantly pivoted during the bending over of the contact substrate region 9. By means of a corresponding constriction or spring prestress of the mutually opposite fixing limbs 6a and 6b, it is possible to achieve a mechanical fixing by force locking in addition to the soldering connection 10.

Instead of a soldering connection, a connection by laser welding or the like can also be produced in each case.

Fundamental advantages of the inventive concept for a substrate for receiving a circuit configuration of electronic components are to be seen in the fact that, in particular while retaining the conventional substrate and its production method, in particular the DCB substrate, in conjunction with a heat dissipation possibility for the substrate or the contact element to be provided, the stability thereof with respect to alternating mechanical and/or thermal load or stresses is ensured (DCB, direct copper bonding).

In this case, in particular, the overlapping soldering connection or welding connection of the contact element in the fixing region after emplacement of the contact element, in particular as a high-current contact, ensures an optimum mechanical coupling and strength. The conductor tracks can then be connected to the contact element, in particular to a high-current contact, in a correspondingly large-area manner, thereby ensuring a corresponding removal of heat or heat dissipation to a heat sink, preferably to a cooled baseplate on the underside of the substrate.

On account of the mechanical stability, the contact element is also pressure-resistant and thus suitable for press-fit circuit boards or the like. The fixing region is resilient under the thermally generated alternating mechanical load, so that only a minimal mechanical tension is exerted on the soldering connection and the electrical and thermal contact remain. The formation of the contact-connection in the fixing region, preferably by soldering connection or welding connection, at the edge of the active substrate area yields a particularly space-saving and small design.

Despite the procedure according to the invention, a customary production method for the substrate for receiving a circuit configuration, in particular a DCB production method, is possible.

We claim:

1. A substrate for receiving a circuit configuration of electronic components, comprising:
    a substantially planar carrier substrate defining a plane and having a surface;
    a contact substrate formed at least partly of surface regions disposed on said surface of said carrier substrate and adapted to be connected to electronic components of the circuit configuration;
    said contact substrate including a contiguous contact substrate region;
    said contact substrate region having a first part forming a surface region disposed on and mechanically connected to said carrier substrate;
    said contact substrate region having a second part projecting out of said plane of said carrier substrate;
    said first part and said second part of said contact substrate region forming at least a part of a fixing region adapted to receive a contact element for conducting electrical current and for electrically and mechanically connecting to the contact element; and
    at least one contact element electrically and mechanically connected to said contact substrate through said fixing region and configured to conduct electrical current, said contact element having a contact projecting out of said plane defined by said carrier substrate.

2. The substrate according to claim 1, wherein said carrier substrate is a ceramic carrier substrate.

3. The substrate according to claim 1, wherein said contact substrate is a metallic substrate.

4. The substrate according to claim 1, wherein said fixing region is disposed in an edge region of the substrate.

5. The substrate according to claim 1, wherein said fixing region forms an edge region of the substrate.

6. The substrate according to claim 1, which comprises an edge region oriented out of said plane of the substrate, said edge region forming at least a part of said fixing region.

7. The substrate according to claim 1, which comprises an edge region at least partly bent out of said plane of the substrate, said edge region forming at least a part of said fixing region.

8. The substrate according to claim 1, wherein said surface of said carrier substrate is a first surface, and wherein a heat sink is disposed on a second surface opposite said first surface.

9. The substrate according to claim 8, wherein said heat sink is a metallic heat dissipation layer.

10. The substrate according to claim 1, wherein the substrate is a direct copper bonded substrate.

11. The substrate according to claim 1, which comprises a soldering connection in each case electrically and mechanically connecting said contact element to each of said first part and said second part of said contact substrate region.

12. The substrate according to claim 1, which comprises a welding connection in each case electrically and mechanically connecting said contact element to each of said first part and said second part of said contact substrate region.

13. The substrate according to claim 1 configured for contacting and supporting a power semiconductor module thereon.

14. A method for producing the substrate according to claim 1, the method which comprises:
    providing a carrier substrate defining a plane, and disposing a contact substrate thereon;
    forming a recess in the carrier substrate at a predetermined bending location thereof substantially in a contiguous portion of the contact substrate;
    bending the contiguous portion along the bending location defined by the recess to form a bending region projecting out of the plane of the carrier substrate and forming at least a part of a fixing region; and
    connecting at least one contact element electrically and mechanically to the contact substrate at the fixing region, the contact element having a contact projecting out of the plane defined by the carrier substrate and configured to conduct electrical current.

15. The method according to claim 14, which comprises producing the substrate in a direct copper bonding process.

16. The method according to claim 14, which further comprises electrically and mechanically connecting at least one contact element to the contact substrate via the fixing region, the contact element having a contact projecting out of the plane defined by the carrier substrate and being configured to conduct electrical current.

17. The method according to claim 16, which comprises soldering or welding the contact element to each of the first part and the second part of the contact substrate region.

18. The method according to claim 14, which comprises configuring the carrier substrate and the contact substrate for connection to a power semiconductor module.

19. A substrate for receiving a circuit configuration of electronic components, comprising:

a carrier substrate defining a plane;

a contact substrate disposed on said carrier substrate;

a recess formed in said carrier substrate at a predetermined bending location thereof substantially in a contiguous portion of said contact substrate;

said contiguous portion being bent along said bending location defined by said recess forming a bending region projecting out of said plane of said carrier substrate and forming at least a part of a fixing region; and at least one contact element electrically and mechanically connected to said contact substrate through said fixing region, said contact element having a contact projecting out of said plane defined by said carrier substrate and configured to conduct electrical current.

20. The substrate according to claim 19, wherein the substrate is a direct copper bonded substrate.

21. The substrate according to claim 19, which comprises one of a soldered and welded connection connecting said contact element to each of said first part and said second part of said contact substrate region.

22. The substrate according to claim 19, wherein said carrier substrate and said contact substrate are configured for connecting a power semiconductor module.

* * * * *